(12) United States Patent
Seeger

(10) Patent No.: US 11,085,770 B2
(45) Date of Patent: Aug. 10, 2021

(54) APPLYING A POSITIVE FEEDBACK VOLTAGE TO AN ELECTROMECHANICAL SENSOR UTILIZING A VOLTAGE-TO-VOLTAGE CONVERTER TO FACILITATE A REDUCTION OF CHARGE FLOW IN SUCH SENSOR REPRESENTING SPRING SOFTENING

(71) Applicant: INVENSENSE, INC., San Jose, CA (US)

(72) Inventor: Joseph Seeger, Menlo Park, CA (US)

(73) Assignee: INVENSENSE, INC., San Jose, CA (US)

( * ) Notice: Subject to any disclaimer, the term of this patent is extended or adjusted under 35 U.S.C. 154(b) by 152 days.

(21) Appl. No.: 16/540,852

(22) Filed: Aug. 14, 2019

(65) Prior Publication Data

US 2020/0056887 A1 Feb. 20, 2020

Related U.S. Application Data

(63) Continuation-in-part of application No. 16/460,901, filed on Jul. 2, 2019.

(Continued)

(51) Int. Cl.
*G01C 19/5776* (2012.01)
(52) U.S. Cl.
CPC ................ *G01C 19/5776* (2013.01)
(58) Field of Classification Search
CPC ......... G01C 19/5776; H03F 3/70; H03F 1/38; G01D 3/02

(Continued)

(56) References Cited

U.S. PATENT DOCUMENTS

| 5,675,296 A | 10/1997 | Tomikawa |
| 2008/0000296 A1* | 1/2008 | Johnson ............. G01C 19/5719 73/514.18 |

(Continued)

FOREIGN PATENT DOCUMENTS

| EP | 1873489 A1 | 1/2008 |
| EP | 2317645 A1 | 5/2011 |

OTHER PUBLICATIONS

International Search Report dated Oct. 9, 2019 for PCT Application No. PCT/US2019/046551, 16 pages.

(Continued)

*Primary Examiner* — Tarun Sinha
(74) *Attorney, Agent, or Firm* — Amin, Turocy & Watson, LLP

(57) ABSTRACT

Reducing, at a common sense electrode of a group of sensors of a system, a common charge flow due to a common motion of the group of sensors is presented herein. The group of electromechanical sensors generates a common charge flow as a result of a common motion of the group of electromechanical sensors and a differential charge flow as a result of a differential motion of the group of electromechanical sensors—respective sense elements of the group of electromechanical sensors being electrically connected at the common sense electrode. The system further comprises a voltage-to-voltage converter component that generates, via an output of the voltage-to-voltage converter component, a positive feedback voltage, and minimizes the common charge flow by coupling, via a defined feedback capacitance, the positive feedback voltage to the common sense electrode—the common sense electrode being electrically coupled to an input of the voltage-to-voltage converter component.

26 Claims, 11 Drawing Sheets

Related U.S. Application Data

(60) Provisional application No. 62/718,954, filed on Aug. 14, 2018.

(58) Field of Classification Search
USPC ........................................................ 73/504.12
See application file for complete search history.

(56) References Cited

U.S. PATENT DOCUMENTS

| | | |
|---|---|---|
| 2014/0264652 A1 | 9/2014 | Cagdaser et al. |
| 2015/0023529 A1 | 1/2015 | Barzen et al. |

OTHER PUBLICATIONS

International Search Report dated Sep. 12, 2019 for PCT Application No. PCT/US2019/042092, 16 pages.
Jawed, Syed Arsalan. "CMOS Readout Interfaces for MEMS Capacitive Microphones" PhD Dissertation—University of Trento, Mar. 2009, [http://eprints-phd.biblio.unitn.it/82/1/thesis_mems_microphone_readout.pdf], 123 pages.
International Search Report dated Oct. 09, 2019 for PCT Application No. PCT/US2019/042092, 16 pp.
International Preliminary Report on Patentability dated Feb. 25, 2021 for PCT Application No. PCT/US2019/046551, 9 pages.
European Office Action dated Mar. 23, 2021 for EP Application No. 19746389.6, 3 pages.

\* cited by examiner

US 11,085,770 B2

APPLYING A POSITIVE FEEDBACK VOLTAGE TO AN ELECTROMECHANICAL SENSOR UTILIZING A VOLTAGE-TO-VOLTAGE CONVERTER TO FACILITATE A REDUCTION OF CHARGE FLOW IN SUCH SENSOR REPRESENTING SPRING SOFTENING

RELATED APPLICATION

This patent application claims priority to, and is a continuation-in-part of, U.S. patent application Ser. No. 16/460,901, filed Jul. 2, 2019, and entitled "APPLYING A POSITIVE FEEDBACK VOLTAGE TO AN ELECTROMECHANICAL SENSOR UTILIZING A VOLTAGE-TO-VOLTAGE CONVERTER TO FACILITATE A REDUCTION OF CHARGE FLOW IN SUCH SENSOR REPRESENTING SPRING SOFTENING," which claims priority to U.S. Provisional Patent Application No. 62/718,954, filed on Aug. 14, 2018, and entitled "GYRO SENSE AMP ARCHITECTURE FOR CANCELLING SPRING SOFTENING EFFECT BY APPLYING CONSTANT CHARGE." The entirety of the aforementioned applications are hereby incorporated by reference herein.

TECHNICAL FIELD

The subject disclosure generally relates to embodiments for applying a positive feedback voltage to an electromechanical sensor utilizing a voltage-to-voltage (V2V) converter to facilitate a reduction of charge flow in such sensor representing spring softening.

BACKGROUND

Sensor systems can comprise more than one sensor, e.g., proof masses, which can be designed to move differentially in response to a Coriolis force. However, conventional sensor systems are susceptible to effects from a common motion, e.g., linear acceleration, being applied to the sensors. In this regard, a linear acceleration of the sensors can create a mutual charge that flows to/from the sensors—the mutual charge changing an electrostatic force corresponding to the sensors and representing a "spring softening" effect on electromechanical sense elements of the sensors. In this regard, conventional sensor technologies have had some drawbacks, some of which may be noted with reference to the various embodiments described herein below.

BRIEF DESCRIPTION OF THE DRAWINGS

Non-limiting embodiments of the subject disclosure are described with reference to the following figures, wherein like reference numerals refer to like parts throughout the various views unless otherwise specified.

DETAILED DESCRIPTION

Figure 1:
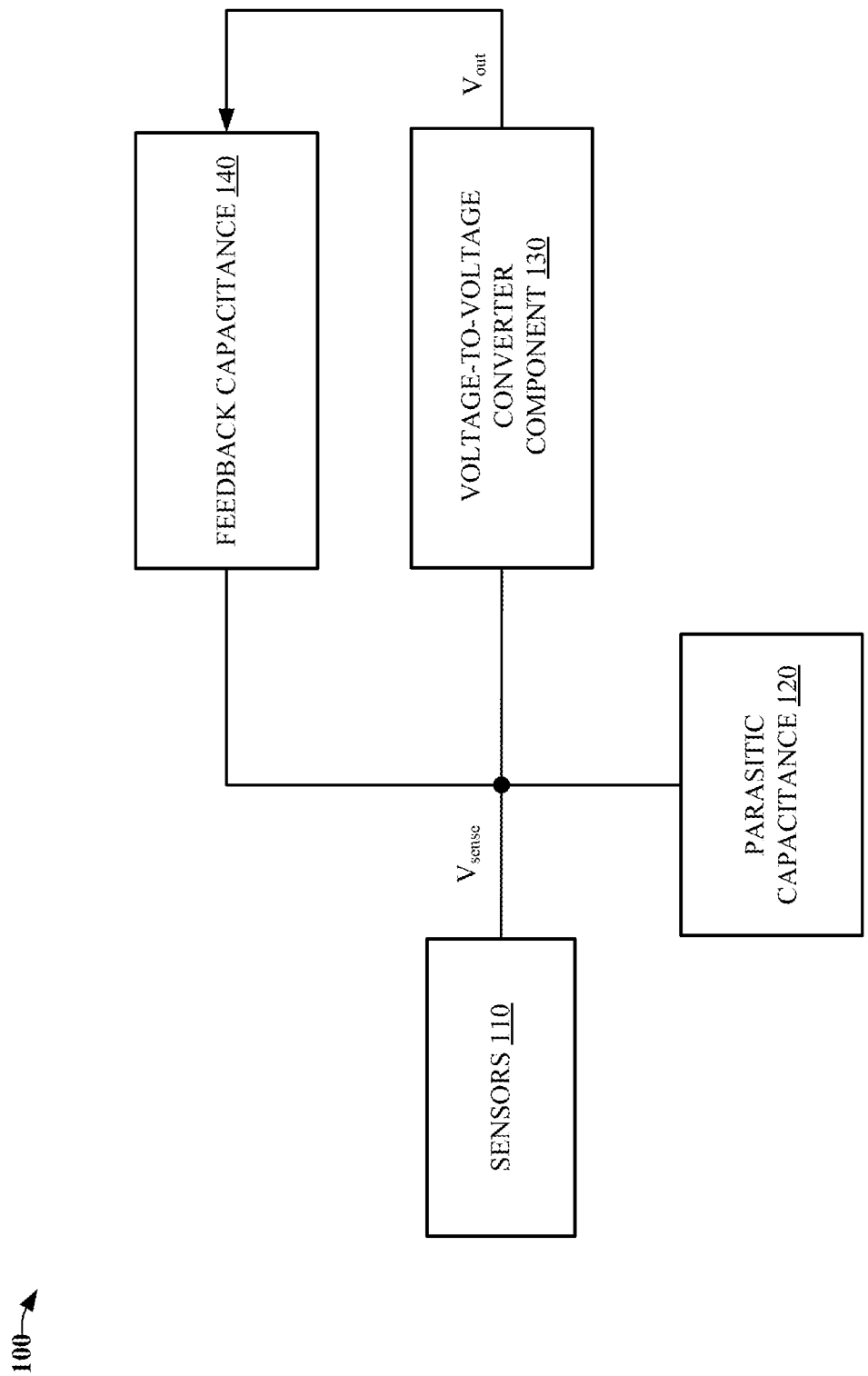
FIG. 1 illustrates a block diagram of a sensor system utilizing a V2V converter component to apply a positive feedback voltage to a common sense electrode of a group of electromechanical sensors to minimize a common charge flow resulting from a common motion of such sensors, in accordance with various example embodiments.

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

Conventional sensor systems are susceptible to effects from a common motion being applied to sensors that are not rigidly coupled to other sensors, e.g., via a defined physical and/or mechanical linkage. For example, a linear acceleration being applied to proof masses, e.g., having no defined physical/mechanical linkage, and/or being flexibly coupled to other proof mass(es), creates a mutual charge that flows to/from the proof masses. In this regard, the mutual charge changes an electrostatic force corresponding to the proof masses and results in an electrostatic "spring softening" effect on electromechanical sense elements of the proof masses.

On the other hand, various embodiments disclosed herein can reduce the mutual charge that flows to/from sensors, which are not rigidly coupled to other sensor(s) (e.g., of a gyroscope), by electrically connecting respective sense electrodes of the sensors to a common sense electrode, and maintaining a constant charge at the common sense electrode—effectively eliminating electrostatic spring softening effects on the sensors.

For example, a system, e.g., gyroscope, can comprise a group of electromechanical sensors that are not rigidly coupled to other sensors of the group and that comprise respective sense elements that have been electrically connected at a common sense electrode. In this regard, the group of electromechanical sensors can generate a common charge flow as a result of a common, in-phase, etc. motion of the group of electromechanical sensors and a differential charge flow as a result of a differential, out-of-phase, etc. motion of the group of electromechanical sensors.

Further, the system can comprise a voltage-to-voltage (V2V) converter component that generates, via an output of the V2V converter component, a positive feedback voltage and minimizes the common charge flow by coupling, via a defined feedback capacitance, the positive feedback voltage to the common sense electrode—the common sense electrode being electrically coupled to an input of the V2V converter component.

In embodiment(s), the V2V converter component minimizes the common charge flow by maintaining, via the defined feedback capacitance, a constant charge at the common sense electrode.

In other embodiment(s), the common motion corresponds to a common motion resonant frequency of the group of electromechanical sensors, the differential motion corresponds to a differential motion resonant frequency of the group of electromechanical sensors, and the maintaining the constant charge results in a separation, further separation, etc. of the common motion resonant frequency from the differential motion resonant frequency.

In yet other embodiment(s), in response to the maintaining the constant charge at the common sense electrode, the V2V converter component decreases a magnitude of an output of the group of electromechanical sensors corresponding to the common motion resonant frequency.

In embodiment(s), the respective sense elements comprise capacitive sense elements, and the system further comprises a bias voltage component that applies a bias voltage to the capacitive sense elements.

In an embodiment, the V2V converter component comprises a unity-gain voltage buffer comprising, within a defined error tolerance (e.g., +/−1%), a gain of one. Further, the input of the V2V converter component is electrically connected to an input of the unity-gain voltage buffer.

In one embodiment, an output of the unity-gain voltage buffer is electrically connected to an output of the V2V converter component.

In another embodiment, the input of the unity-gain voltage buffer is electrically connected to a first capacitance terminal of a defined shield capacitance of the system, e.g., corresponding to shield routing, e.g., electrical trace(s) of the system that facilitate shielding at least a portion of the common sense electrode from an electromagnetic field.

Further, the output of the unity-gain voltage buffer is electrically connected to a second capacitance terminal of the defined shield capacitance—the unity-gain voltage buffer comprising a bootstrapping buffer. In this regard, the shield routing is bootstrapped to a voltage of the common sense electrode using the bootstrapping buffer to eliminate, substantially reduce (e.g., by over 95%), etc. a change in charge at the common sense electrode due to parasitic capacitance of the shield routing.

In yet another embodiment, the V2V converter component further comprises: a defined input capacitance; a defined amplifier feedback capacitance; and an inverting amplifier comprising a defined negative gain represented by a ratio of the defined input capacitance to the defined amplifier feedback capacitance. In this regard, the defined input capacitance is electrically coupled between the output of the unity-gain voltage buffer and an input of the inverting amplifier; and the defined amplifier feedback capacitance is electrically coupled between the input of the inverting amplifier and an output of the inverting amplifier.

Further, the V2V converter component comprises a unity-gain inverting voltage buffer comprising, within a defined error tolerance, e.g., within 1%, a gain of negative one. In this regard, the output of the inverting amplifier is electrically connected to an input of the unity-gain inverting voltage buffer, and an output of the unity-gain inverting voltage buffer is electrically connected to the output of the V2V converter component.

In an embodiment, a defined parasitic capacitance is electrically connected to the input of the V2V converter component.

In one embodiment, a value of the defined feedback capacitance is proportional, based on the defined negative gain of the inverting amplifier, to the defined parasitic capacitance.

In other embodiment(s), the input of the inverting amplifier is coupled, via a coupling capacitance, to a defined self-test voltage that facilitates generation of a force on at least one sense element of the respective sense elements.

In yet other embodiment(s), the system does not utilize the bootstrapping buffer, and the defined parasitic capacitance is electrically connected to the defined input capacitance that is electrically coupled to the input of the inverting amplifier. In this regard, the defined parasitic capacitance comprises the defined shield capacitance corresponding to at least one electrical trace of the system that facilitates the shielding of at least the portion of the common sense electrode from the electromagnetic field. Further, unlike embodiment(s) comprising the bootstrapping buffer, the value of the defined feedback capacitance is proportional, based on the defined negative gain of the inverting amplifier, to a sum of the defined parasitic capacitance and the defined input capacitance.

In embodiment(s), a system can comprise a micro-electromechanical system (MEMS) sensor comprising proof masses that have been electrically connected at respective sense nodes—the proof masses not being rigidly connected, e.g., via a physical/mechanical linkage. In this regard, the proof masses generate a common charge flow as a result of an in-phase, common, etc. movement of the proof masses, and generate a differential charge flow as a result of an out-of-phase, differential, etc. movement of the proof masses.

Further, the system comprises a V2V converter component comprising a differential amplifier, in which the V2V converter component minimizes the common charge flow by coupling, via respective defined feedback capacitances, a positive differential feedback voltage to the respective sense nodes—the respective sense nodes being electrically coupled to respective inputs of the V2V converter component.

In embodiment(s), a corresponding gain of the differential amplifier can be inverted by switching outputs of the differential amplifier that are connected to differential inputs of a following stage, amplification stage, capacitive stage, etc. Accordingly, use of a unity-gain inverting voltage buffer is not required.

In other embodiment(s), respective defined input capacitances of the system are electrically coupled between the respective sense nodes and differential inputs of the differential amplifier In yet other embodiment(s), respective defined amplifier feedback capacitances are electrically coupled between the differential inputs of the differential amplifier and respective outputs of the differential amplifier. Further, the respective defined feedback capacitances are electrically coupled between the respective outputs of the differential amplifier and the respective sense nodes.

In embodiment(s), the in-phase, common, etc. movement corresponds to first resonant frequency of the proof masses, and the out-of-phase, differential, etc. movement corresponds to a second resonant frequency of the proof masses. In turn, the V2V converter component, based on a minimization of the common charge flow, increases a separation between the first resonant frequency and the second resonant frequency.

In other embodiment(s), the V2V converter component, based on the minimization of the common charge flow, decreases a magnitude of an output of the proof masses corresponding to the first resonant frequency corresponding to the in-phase, common, etc. movement of the proof masses.

In an embodiment, a method comprises applying, by a system comprising a group of MEMS sensors, a bias voltage to respective sense elements of the group of MEMS sensors, in which sense electrodes of the respective sense elements are electrically connected at a common sense electrode, the group of MEMS sensors generate a common charge flow as a result of a common motion of the group of MEMS sensors, and the group of MEMS sensors generate a differential charge flow as a result of a differential motion of the group of MEMS sensors.

Further, the method comprises minimizing, by the system, the common charge flow by coupling, utilizing a V2V converter component of the system via a defined feedback capacitance, a positive feedback voltage to the common sense electrode.

In an embodiment, the minimizing the common charge flow comprises maintaining, via the V2V converter component, a constant charge at the common sense electrode.

In another embodiment, the common motion corresponds to a common mode resonant frequency of the group of MEMS sensors, the differential motion corresponds to a differential mode resonant frequency of the group of MEMS sensors, and the minimizing the common charge flow increases a separation between the common mode resonant frequency and the differential mode resonant frequency.

In yet another embodiment, the minimizing the common charge flow further decreases a magnitude of an output of the group of MEMS sensors corresponding to the common mode resonant frequency.

As described above, conventional sensor technologies are susceptible to effects from a common motion being applied to sensors that are not rigidly coupled to other sensors, e.g., via a defined physical and/or mechanical linkage. For example, a linear acceleration being applied to proof masses, e.g., having no defined physical/mechanical linkage, and/or being flexibly coupled to other proof mass(es), creates a mutual charge that flows to/from the proof masses. In this regard, the mutual charge changes an electrostatic force corresponding to the proof masses and results in an electrostatic spring softening effect on electromechanical sense elements of the proof masses.

On the other hand, various embodiments disclosed herein can reduce the mutual charge that flows to/from sensors that are not rigidly coupled to other sensor(s) by electrically connecting respective sense electrodes of the sensors to a common sense electrode, and maintaining a constant charge at the common sense electrode—effectively eliminating electrostatic spring softening effects on the sensors.

In this regard, and now referring to FIG. 1, a block diagram of a sensor system (100), e.g., a gyroscope, utilizing a V2V converter component (130) to apply a positive feedback voltage ("$V_{out}$") to a common sense electrode of a group of electromechanical sensors (110) (e.g., comprising capacitive-based sensors, piezoelectric-based sensors, proof masses, etc.) to minimize a common charge flow resulting from a common motion of such sensors is illustrated, in accordance with various example embodiments.

The group of electromechanical sensors are not rigidly coupled to other sensors of the group and comprise respective sense elements, e.g., capacitances, that have been electrically connected at a common sense electrode, e.g., corresponding to "$V_{sense}$". In this regard, in embodiment(s), the group of electromechanical sensors do not comprise a physical and/or mechanical linkage. In other embodiment(s), the group of electromechanical sensors are flexibly coupled, e.g., via mechanical spring(s).

Further, the group of electromechanical sensors can generate a common charge flow as a result of a common, in-phase, etc. motion of the group of electromechanical sensors and a differential charge flow as a result of a differential, out-of-phase, etc. motion of the group of electromechanical sensors. In embodiment(s), during the common, in-phase, etc. motion of the group of electromechanical sensors, the respective sense elements, e.g., capacitances, of the group of electromechanical sensors vary in-phase; and during the differential, out-of-phase, etc. motion of the group of electromechanical sensors, the respective sense elements, e.g., capacitances, of the group of electromechanical sensors vary out-of-phase. In this regard, the common charge flow represents a change of charge on the respective sense elements, e.g., capacitances, and the change of charge alters an electrostatic force corresponding to at least a portion of the group of electromechanical sensors.

Returning to FIG. 1, the V2V converter component generates, via an output of the V2V converter component, the positive feedback voltage and minimizes the common charge flow by coupling, via the defined feedback capacitance, the positive feedback voltage to the common sense electrode—the common sense electrode being electrically coupled to an input of the V2V converter component In embodiment(s), the V2V converter component minimizes the common charge flow by maintaining, via the defined feedback capacitance, a constant charge at the common sense electrode.

In other embodiment(s), the common motion corresponds to a common motion resonant frequency of the group of electromechanical sensors, the differential motion corresponds to a differential motion resonant frequency of the group of electromechanical sensors, and the maintaining the constant charge results in a separation, further separation, etc. of the common motion resonant frequency from the differential motion resonant frequency.

In yet other embodiment(s), in response to the maintaining the constant charge at the common sense electrode, the V2V converter component decreases a magnitude of an output, e.g., voltage, of the group of electromechanical sensors corresponding to the common motion resonant frequency.

Figure 2:
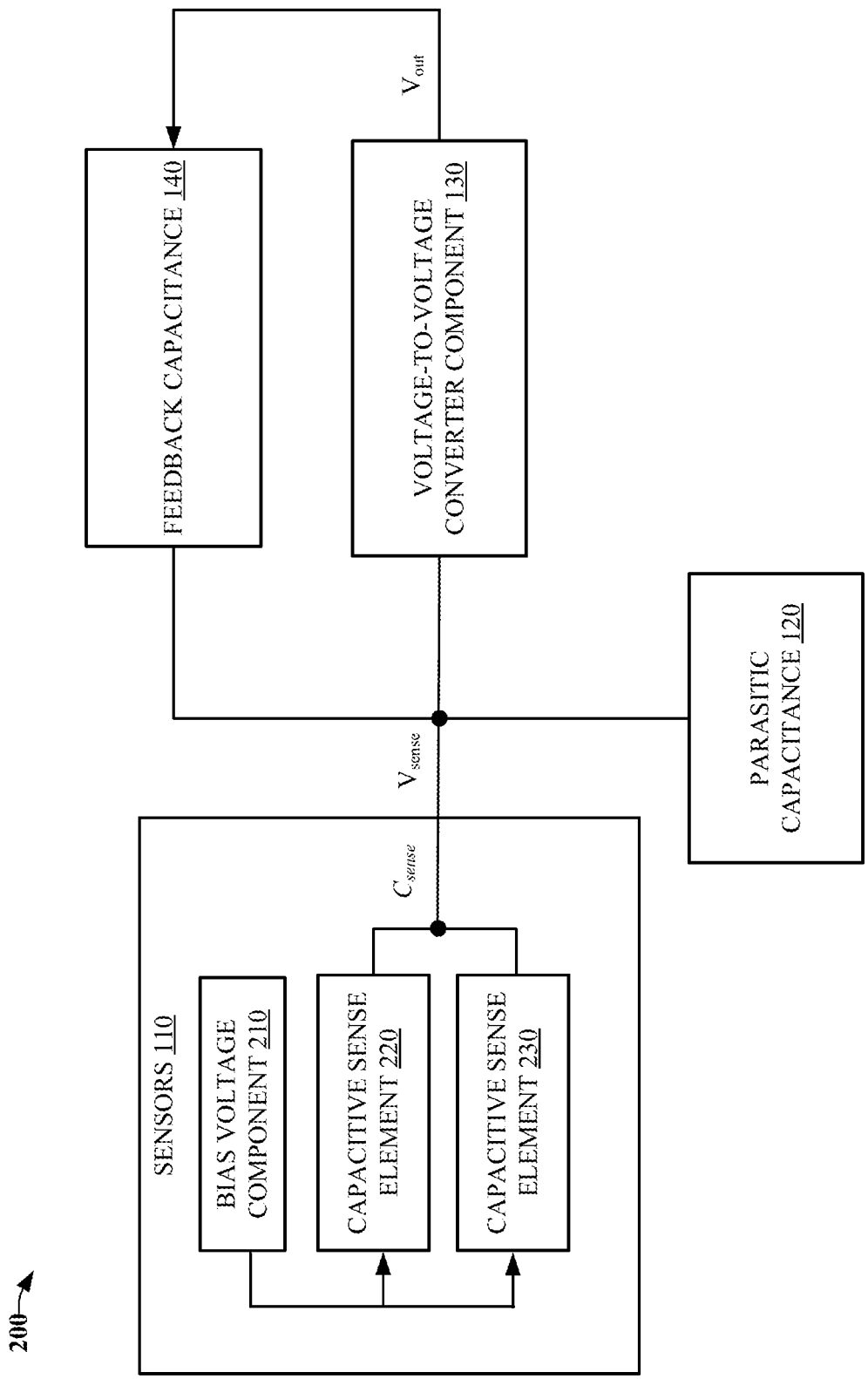
FIG. 2 illustrates a block diagram of a sensor system utilizing a V2V converter component to apply a positive feedback voltage to a common sense electrode of a group of electromechanical sensors comprising capacitive sense elements that are biased by a bias voltage component, in accordance with various example embodiments.

Referring now to FIG. 2, in embodiment(s), the respective sense elements of the group of electromechanical sensors comprise capacitive sense elements (220, 230), e.g., of respective proof masses, electrically connected at the common sense electrode ("$C_{sense}$"), and a bias voltage component (210) applies a bias voltage to respective electrodes, nodes, etc. of the capacitive sense elements. In other embodiment(s) (not shown), the group of electromechanical sensors comprises piezoelectric sensors electrically connected at the common sense electrode.

Figure 3:
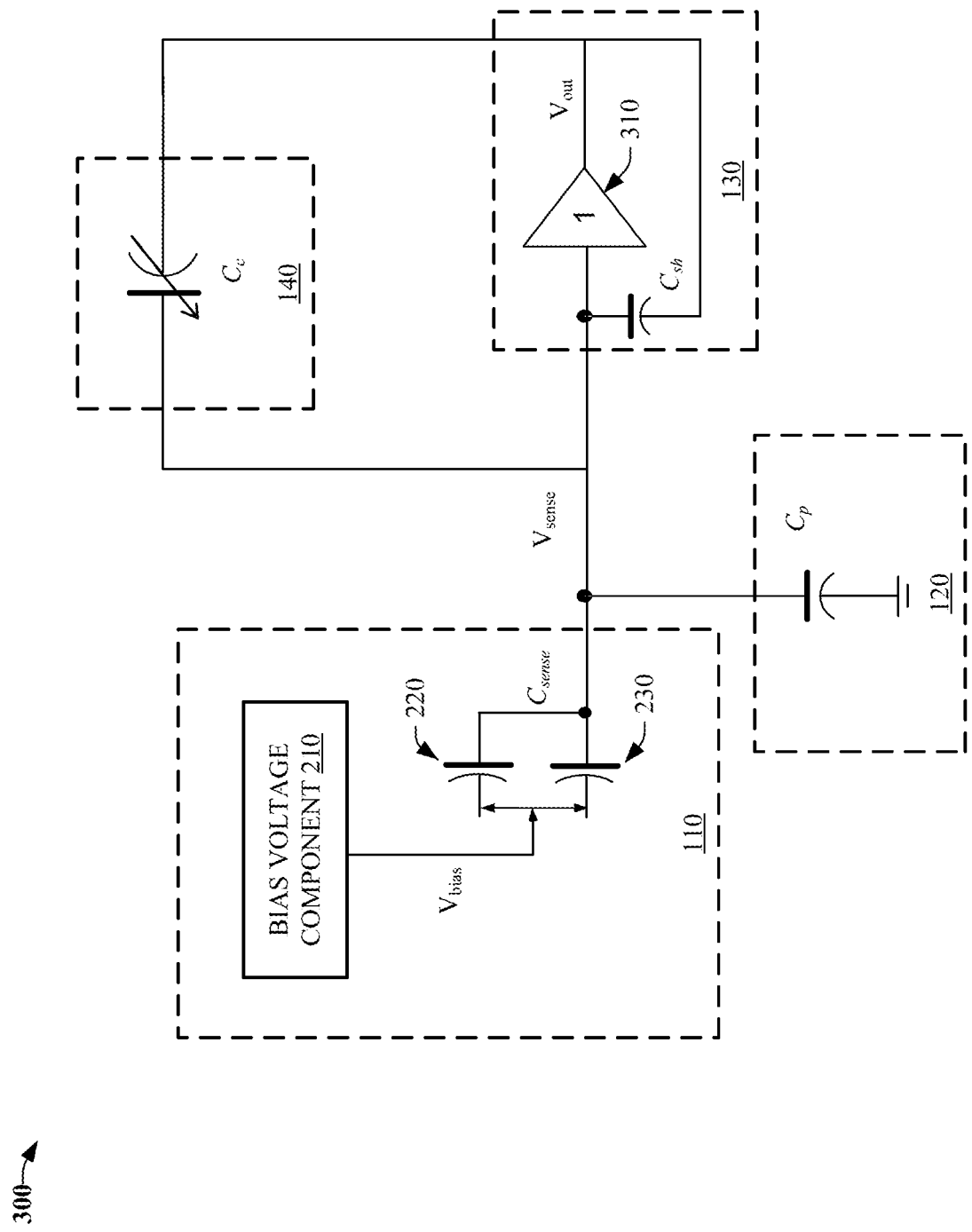
FIG. 3 illustrates a block diagram of a sensor system comprising a V2V converter component that applies a positive feedback voltage to a common sense electrode of capacitive sense elements of a group of electromechanical sensors utilizing a bootstrap buffer that bootstraps a shield capacitance to the common sense electrode, in accordance with various example embodiments.

As illustrated by FIG. 3, the V2V converter component can comprise a unity-gain voltage buffer (310) comprising, within a defined error tolerance (e.g., 1%), a gain of one. Further, an input of the V2V converter component can be electrically connected to, comprise, etc. an input of the unity-gain voltage buffer. In turn, the input of the unity-gain voltage buffer can be electrically connected to a first terminal, node, etc. of a defined shield capacitance ("$C_{sh}$") of the sensor system, and an output of the unity-gain voltage buffer can be electrically connected a second terminal, node, etc. of the defined shield capacitance.

In this regard, the defined shield capacitance can correspond to a shield parasitic capacitance of at least one electrical trace of the system that is directed to shielding at least a portion of the common sense electrode from an electromagnetic field. Further, the unity-gain voltage buffer comprises a bootstrapping buffer that "bootstraps" the defined shield capacitance to the common sense electrode—to eliminate, reduce, etc. any change in charge of the common sense electrode due to the shield parasitic capacitance.

Figure 4:
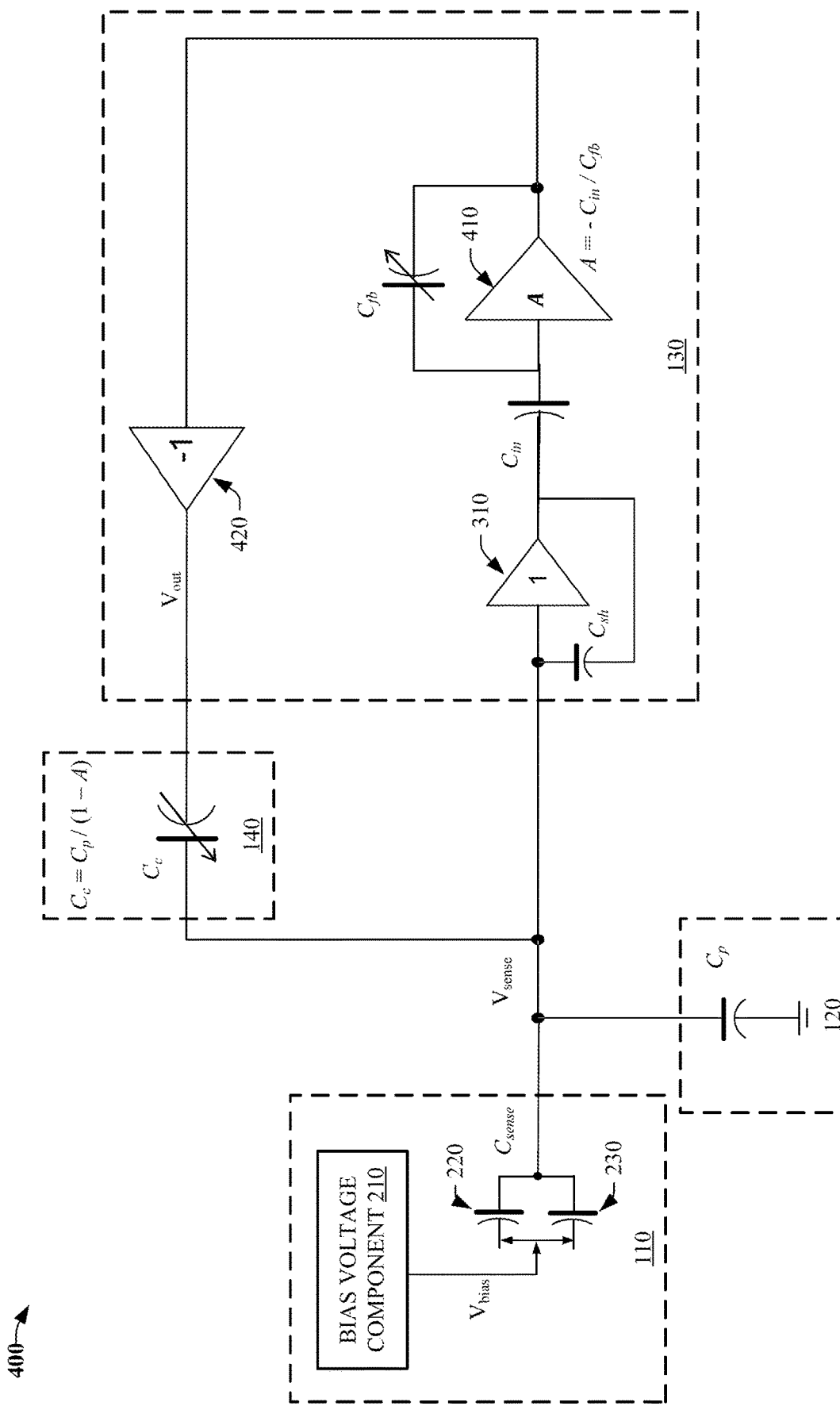
FIG. 4 illustrates a block diagram of a sensor system comprising a V2V converter component that applies a positive feedback voltage to a common sense electrode of capacitive sense elements of a group of electromechanical sensors utilizing a bootstrap buffer that is electrically connected, via an input capacitance, to an inverting amplifier comprising a negative gain that is proportional to the input capacitance, in accordance with various example embodiments.

In embodiment(s) illustrated by FIG. 4, the V2V converter component can further comprise an inverting amplifier (410) comprising a defined negative gain ("A") represented by a ratio of a defined input capacitance ("$C_{in}$") to a defined amplifier feedback capacitance ("$C_{fb}$")—in which $A=-C_{in}/C_{fb}$. In this regard, the defined input capacitance is electrically coupled between the output of the unity-gain voltage buffer and an input of the inverting amplifier; and the defined amplifier feedback capacitance is electrically coupled between the input of the inverting amplifier and an output of the inverting amplifier.

In embodiment(s), the defined amplifier feedback capacitance can be selected, programmed, etc. via programmable, e.g., one-time programmable, fuses that can connect selected capacitors of a programmable array of capacitors (not shown) together to create, form, etc. the defined amplifier feedback capacitance. In this regard, the defined negative gain can be selected, programmed, e.g., during manufacturing of the sensor system.

Further, the V2V converter component comprises a unity-gain inverting voltage buffer (420) comprising, within a defined error tolerance (e.g., 1%), a gain of negative one. In this regard, the output of the inverting amplifier is electrically connected to an input of the unity-gain inverting voltage buffer, and an output of the unity-gain inverting voltage buffer is electrically connected to the output of the V2V converter component.

As further illustrated by FIG. 4, the sensor system can comprise a defined parasitic capacitance ("$C_p$") that is electrically connected to the input of the V2V converter component. In embodiment(s), a value of the defined feedback capacitance ("$C_c$") is proportional, based on the defined negative gain of the inverting amplifier, to the defined parasitic capacitance—in which $C_c=C_p/(1-A)$, e.g., to form a "negative capacitance" coupling the output of the V2V converter component to the common sense electrode, node, etc. In this regard, the value of the defined feedback capacitance can be selected, programmed, etc. based on the selected, programmed, etc. value of the defined negative gain via programmable, e.g., one-time programmable, fuses that can connect selected capacitors of a programmable array of capacitors (not shown) together to create, form, etc. the defined feedback capacitance. In embodiment(s), the defined feedback capacitance can be selected, programmed, e.g., during manufacturing of the sensor system, e.g., to tune a frequency corresponding to the common sense electrode, e.g., that corresponds to a drive frequency of a proof mass of the sensor.

Figure 5:
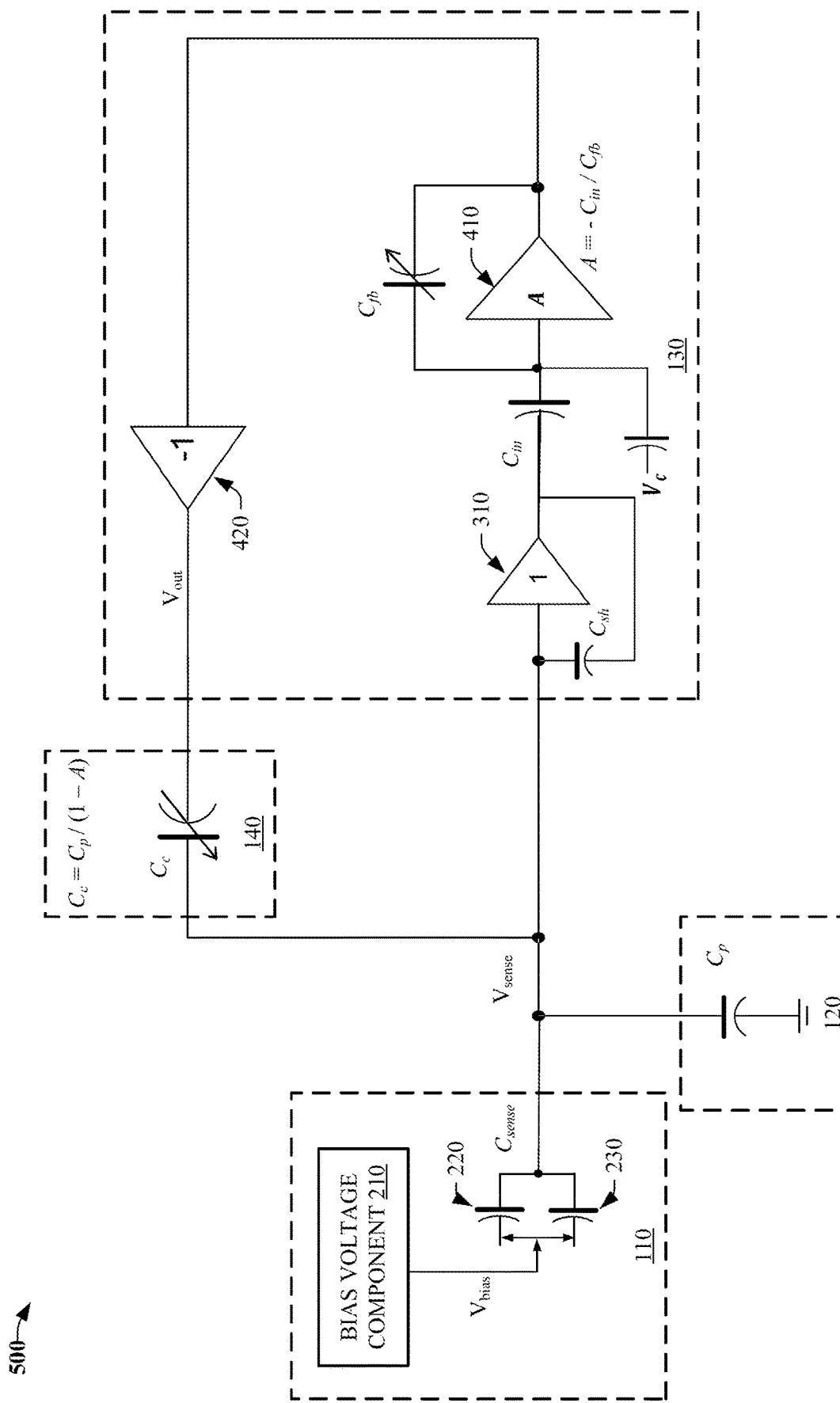
FIG. 5 illustrates a block diagram of another sensor system comprising a V2V converter component that applies a positive feedback voltage to a common sense electrode of capacitive sense elements of a group of electromechanical sensors utilizing a bootstrap buffer that is electrically connected, via an input capacitance, to an inverting amplifier comprising a negative gain that is proportional to the input capacitance, in accordance with various example embodiments.

FIG. 5 illustrates embodiment(s) of the sensor system in which the input of the inverting amplifier is coupled, via a coupling capacitance, to a defined self-test voltage ("$V_c$"). In this regard, the defined self-test voltage can be used to generate a defined force, or defined sense gap displacement, on sense elements (e.g., proof masses) of the group of electromechanical sensors, e.g., to perform a "self-test" on the group of electromechanical sensors, e.g., to compare detected voltage values (e.g., obtained via sense electrode(s) corresponding to various portions, stages, etc. of the V2V converter component, the feedback capacitor, etc.) to expected voltage values, e.g., that have been determined to be generated based on the defined sense gap displacement, etc.

In one embodiment, frequency response(s) of the proof masses can be determined by sweeping a value of the defined self-test voltage and detecting resulting respective voltage values at the sense electrode(s) corresponding to the various portions, states, etc. of the V2V converter component, the feedback capacitor, etc.

Figure 6:
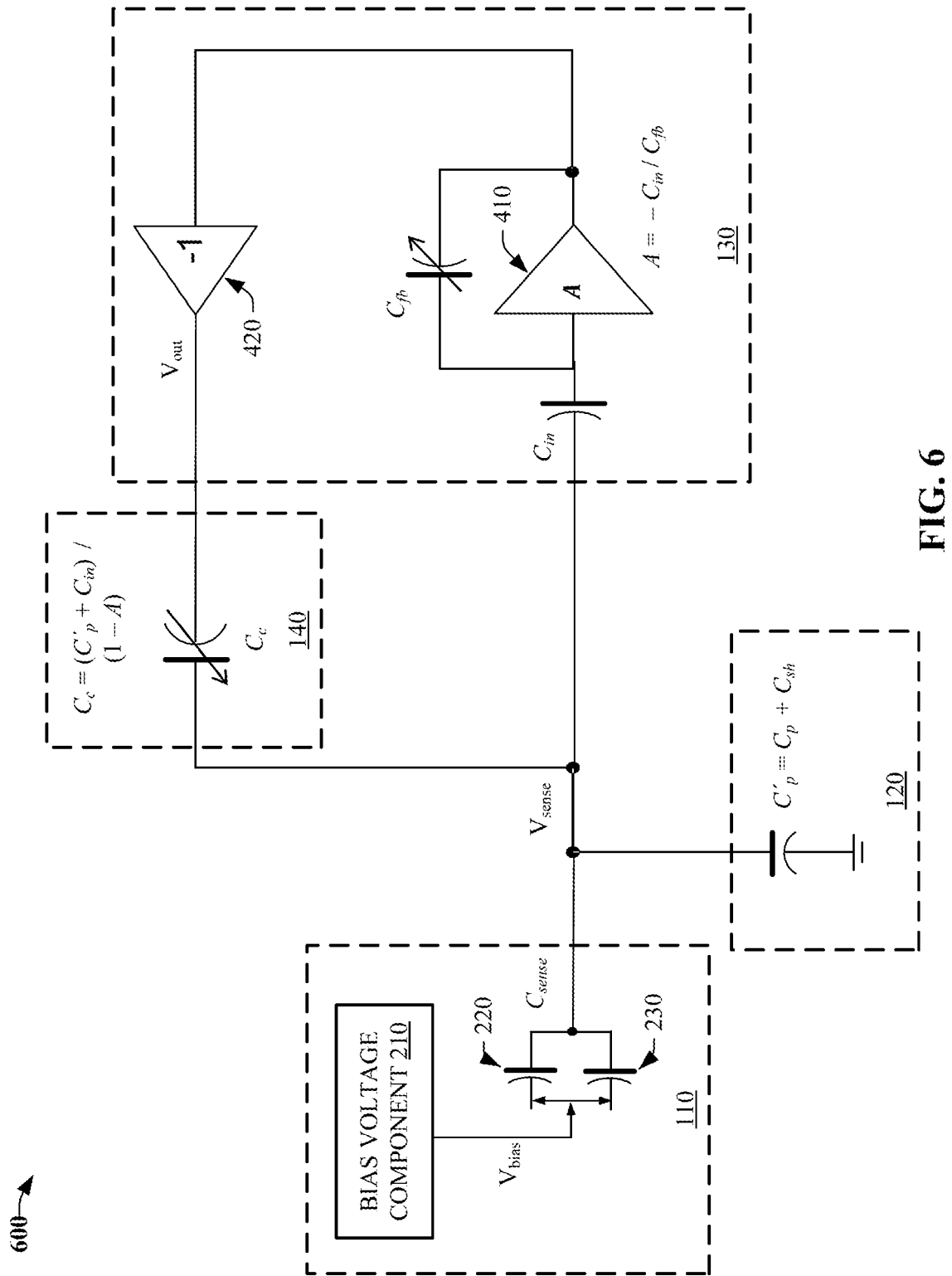
FIG. 6 illustrates a block diagram of a sensor system comprising a V2V converter component that applies a positive feedback voltage to a common sense electrode of capacitive sense elements of a group of electromechanical sensors utilizing an inverting amplifier comprising a negative gain that is proportional to an input capacitance that is electrically connected between the common sense electrode and an input of the inverting amplifier, in accordance with various example embodiments.
Figure 7:
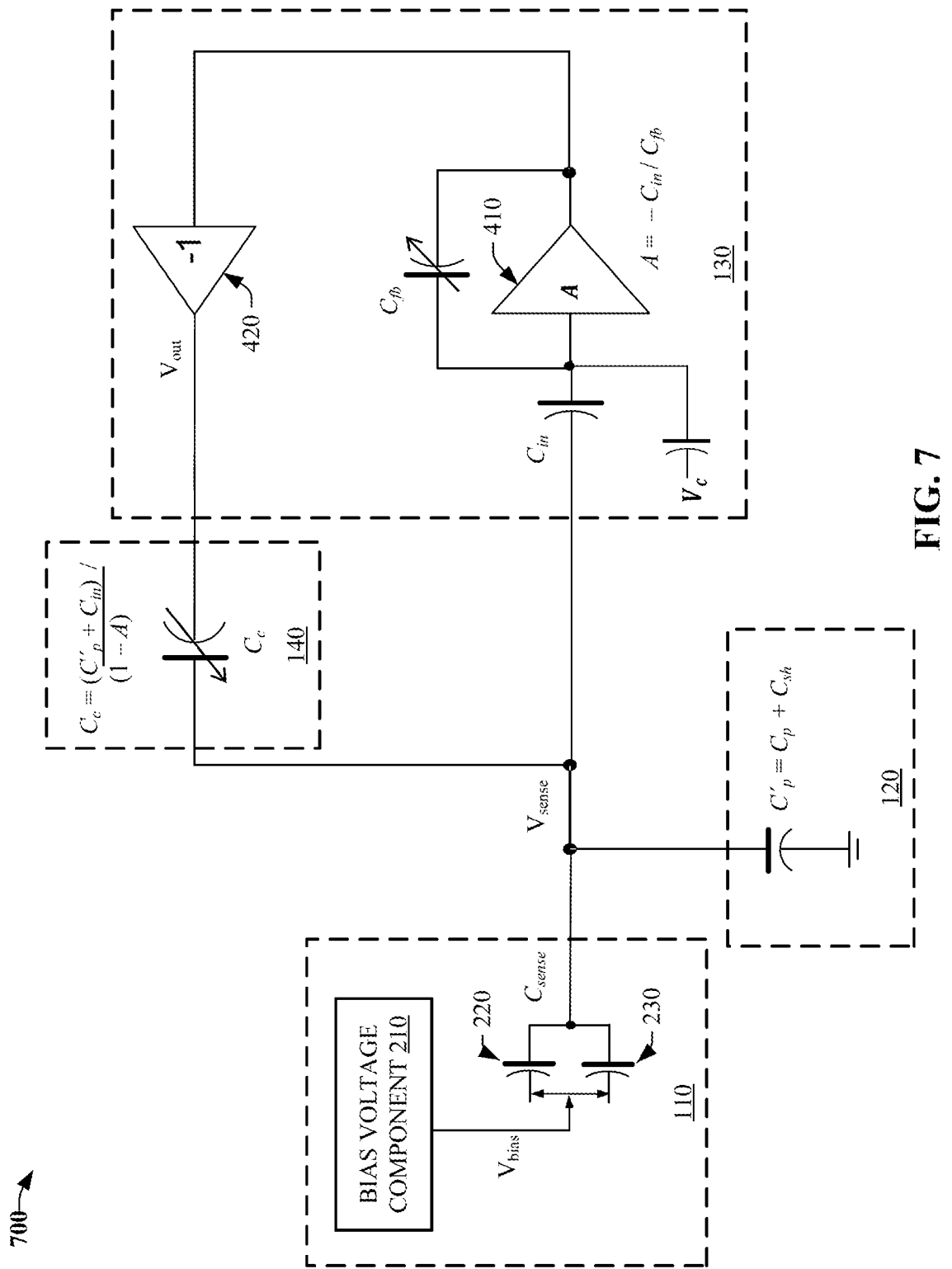
FIG. 7 illustrates a block diagram of another sensor system comprising a V2V converter component that applies a positive feedback voltage to a common sense electrode of capacitive sense elements of a group of electromechanical sensors utilizing an inverting amplifier comprising a negative gain that is proportional to an input capacitance that is electrically connected between the common sense electrode and an input of the inverting amplifier, in accordance with various example embodiments.

FIG. 6 and FIG. 7 illustrate embodiment(s) in which the sensor system does not include, utilize, etc. the bootstrapping buffer, and the defined parasitic capacitance is electrically connected to the defined input capacitance that is electrically coupled to the input of the inverting amplifier. In this regard, the defined parasitic capacitance comprises the defined shield capacitance corresponding to at least one electrical trace of the system that facilitates the shielding of at least the portion of the common sense electrode from the electromagnetic field. Further, unlike embodiment(s) comprising the bootstrapping buffer, the value of the defined feedback capacitance is proportional, based on the defined negative gain of the inverting amplifier, to a sum of the defined parasitic capacitance and the defined input capacitance.

Figure 8:
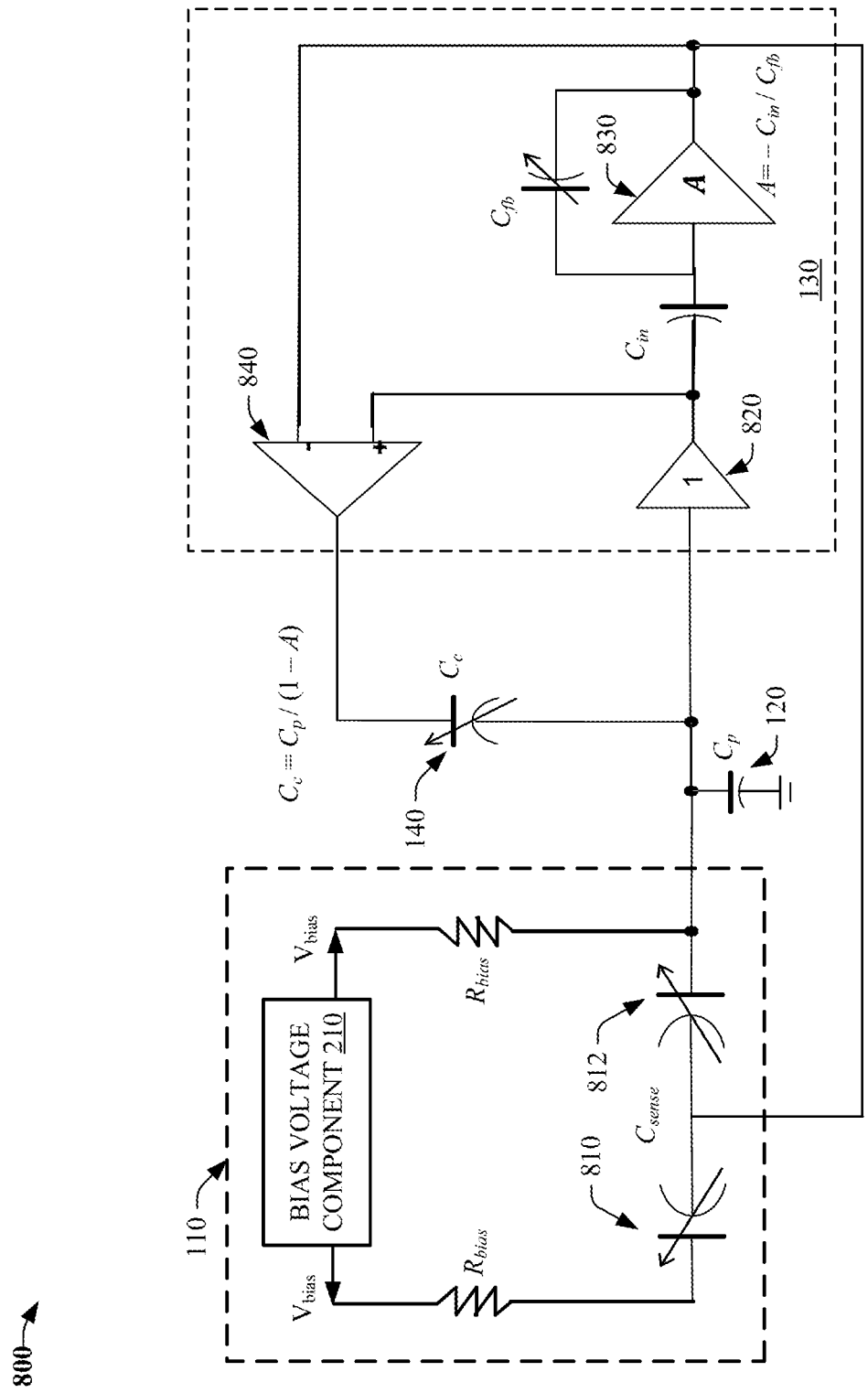
FIG. 8 illustrates a block diagram of a sensor system comprising microphones, in accordance with various example embodiments.

FIG. 8 illustrates a block diagram of a sensor system (800) comprising microphones (810, 812), in accordance with various example embodiments. The microphones comprise respective sense capacitances electrically connected at a common sense electrode ("$C_{sense}$"), and a bias voltage component (210) applies, via respective bias resistors ("$R_{bias}$"), bias voltages (e.g., "$V_{bias}$") to electrodes of the respective sense capacitances.

In turn, the sensor system comprises a V2V converter component (130) that couples, via a feedback capacitance (140) coupled between the V2V converter component and an electrode of the electrodes of the respective sense capacitances, a positive feedback voltage to the electrode, e.g., to maintain a constant charge at the sense electrode. In this regard, the V2V converter component comprises a unity-gain voltage buffer (820) comprising, within a defined error tolerance (e.g., 1%), a gain of one. Further, an input of the V2V converter component is electrically connected to, comprises, etc. an input of the unity-gain voltage buffer. An output of the unity-gain voltage buffer is electrically connected to a non-inverting input of a differential amplifier (840), and is electrically coupled, via a defined input capacitance ("$C_{in}$"), to an inverting amplifier (830). The inverting amplifier comprising a defined negative gain ("A") represented by a ratio of the defined input capacitance ("$C_{in}$") to a defined amplifier feedback capacitance ("$C_{fb}$")—in which $A=-C_{in}/C_{fb}$. In this regard, the defined amplifier feedback capacitance is electrically coupled between the input of the inverting amplifier and an output of the inverting amplifier.

The defined amplifier feedback capacitance can be selected, programmed, etc. via programmable, e.g., one-time programmable, fuses that can connect selected capacitors of a programmable array of capacitors (not shown) together to create, form, etc. the defined amplifier feedback capacitance. In this regard, the defined negative gain can be selected, programmed, e.g., during manufacturing of the sensor system. Further, the output of the inverting amplifier is electrically connected to an inverting input of the differential amplifier, and an output of the differential amplifier is electrically connected to the output of the V2V converter component.

As further illustrated by FIG. 8, the sensor system can comprise a defined parasitic capacitance ("$C_p$") that is electrically connected to the input of the V2V converter component. In embodiment(s), a value of the defined feedback capacitance ("$C_c$") is proportional, based on the defined negative gain of the inverting amplifier, to the defined parasitic capacitance—in which $C_c=C_p/(1-A)$, e.g., to form a "negative capacitance" coupling the output of the V2V converter component to the electrode. In this regard, the value of the defined feedback capacitance can be selected, programmed, etc. based on the selected, programmed, etc. value of the defined negative gain via programmable, e.g., one-time programmable, fuses that can connect selected capacitors of a programmable array of capacitors (not shown) together to create, form, etc. the defined feedback capacitance. In embodiment(s), the defined feedback capacitance can be selected, programmed, e.g., during manufacturing of the sensor system, e.g., to tune a frequency corresponding to the electrode, e.g., corresponding to a resonant frequency, e.g., of a membrane, of the microphone.

Figure 9:
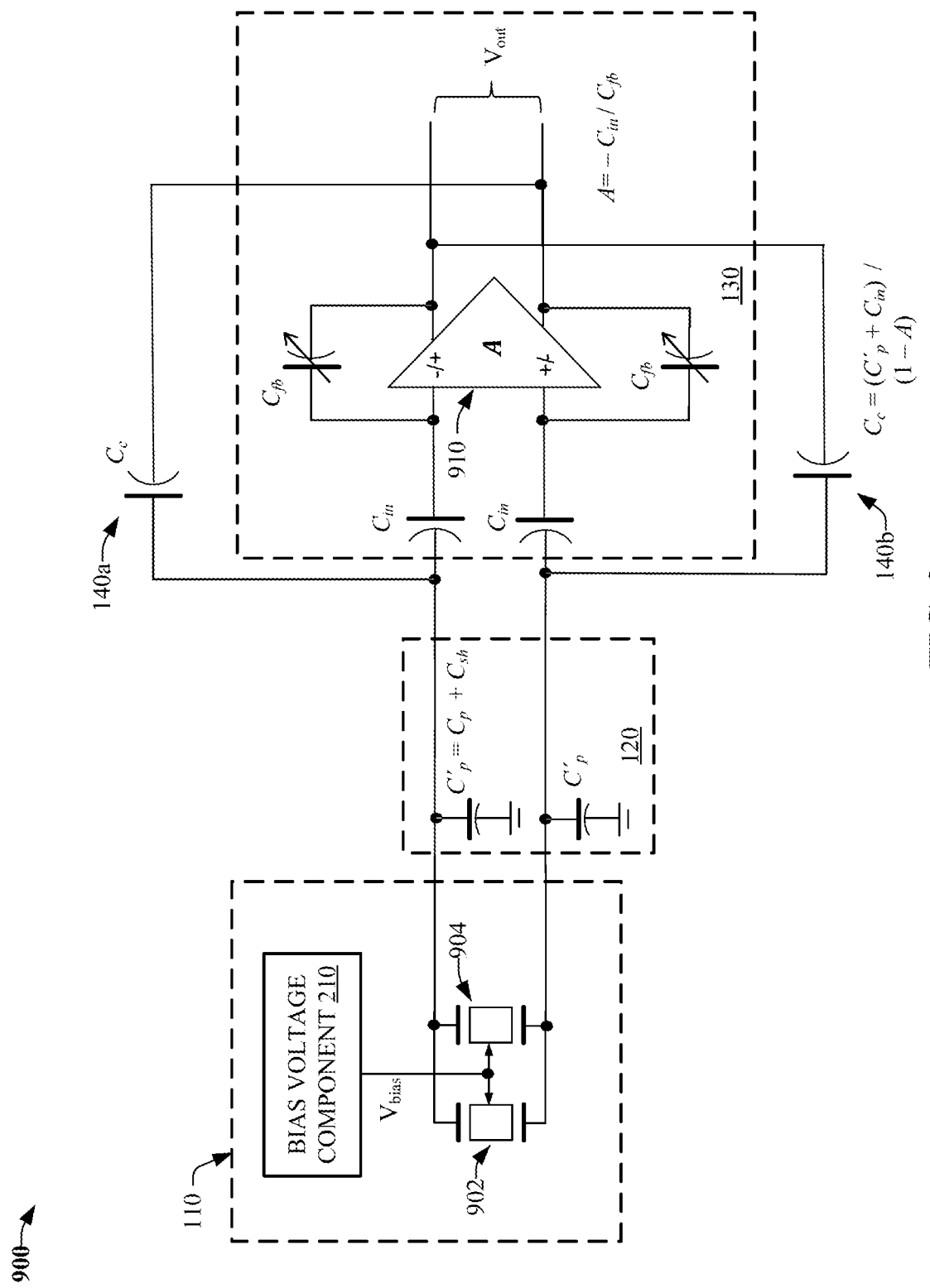
FIG. 9 illustrates a block diagram of a sensor system comprising a V2V converter component comprising a differential amplifier, in accordance with various example embodiments.

FIG. 9 illustrates a block diagram of a MEMS sensor system (900) comprising a V2V component (130) comprising a differential amplifier (910), in accordance with various example embodiments. As illustrated by FIG. 9, the MEMS sensor comprises proof masses (902, 904) that have been electrically connected at respective sense nodes—the proof masses not being rigidly connected, e.g., via a physical/mechanical linkage. In this regard, the proof masses generate a common charge flow as a result of an in-phase, common, etc. movement of the proof masses, and generate a differential charge flow as a result of an out-of-phase, differential, etc. movement of the proof masses. Further, a bias voltage component (210) can apply a bias voltage ($V_{bias}$) to the proof masses. In other embodiments (not shown), the bias voltage component can apply different bias voltages to each of the proof masses.

The MEMS sensor system further comprises a V2V converter component comprising a differential amplifier (910). In this regard, V2V converter component minimizes the common charge flow by coupling, via respective defined feedback capacitances ("$C_c$") (140a, 140b), a positive differential feedback voltage ("$V_{out}$") to the respective sense nodes—the respective sense nodes being electrically coupled to respective inputs of the V2V converter component.

In embodiment(s), a corresponding gain of the differential amplifier can be inverted by switching outputs of the differential amplifier that are connected to differential inputs of a following stage, amplification stage, capacitive stage, etc. Accordingly, use of a unity-gain inverting voltage buffer is not required.

As illustrated by FIG. 9, respective defined input capacitances ("$C_{in}$") of the MEMS sensor system are electrically coupled between the respective sense nodes and differential inputs of the differential amplifier. Further, respective defined amplifier feedback capacitances ("$C_{fb}$") are electrically coupled between the differential inputs of the differential amplifier and respective outputs of the differential amplifier—in which a gain ("A") of the differential amplifier is $A=-C_{in}/C_{fb}$. Further, the respective defined feedback capacitances are electrically connected between the respective outputs of the differential amplifier and the respective sense nodes. In this regard, values of the respective defined feedback capacitances are proportional, based on the defined negative gain of the differential amplifier, to respective defined parasitic capacitances ("$C_p$") that are electrically connected to the respective differential inputs of the differential amplifier—in which $C_c=(C'_p+C_{in})/(1-A)$, e.g., to form "negative capacitances" coupling the respective differential outputs to the sense electrodes.

In embodiment(s), the in-phase, common, etc. movement corresponds to first resonant frequency of the proof masses, and the out-of-phase, differential, etc. movement corresponds to a second resonant frequency of the proof masses. In turn, the V2V converter component, based on a minimization of the common charge flow, increases a separation between the first resonant frequency and the second resonant frequency.

In other embodiment(s), the V2V converter component, based on the minimization of the common charge flow, decreases a magnitude of an output, e.g., voltage, of the proof masses corresponding to the first resonant frequency corresponding to the in-phase, common, etc. movement of the proof masses.

Figure 10:
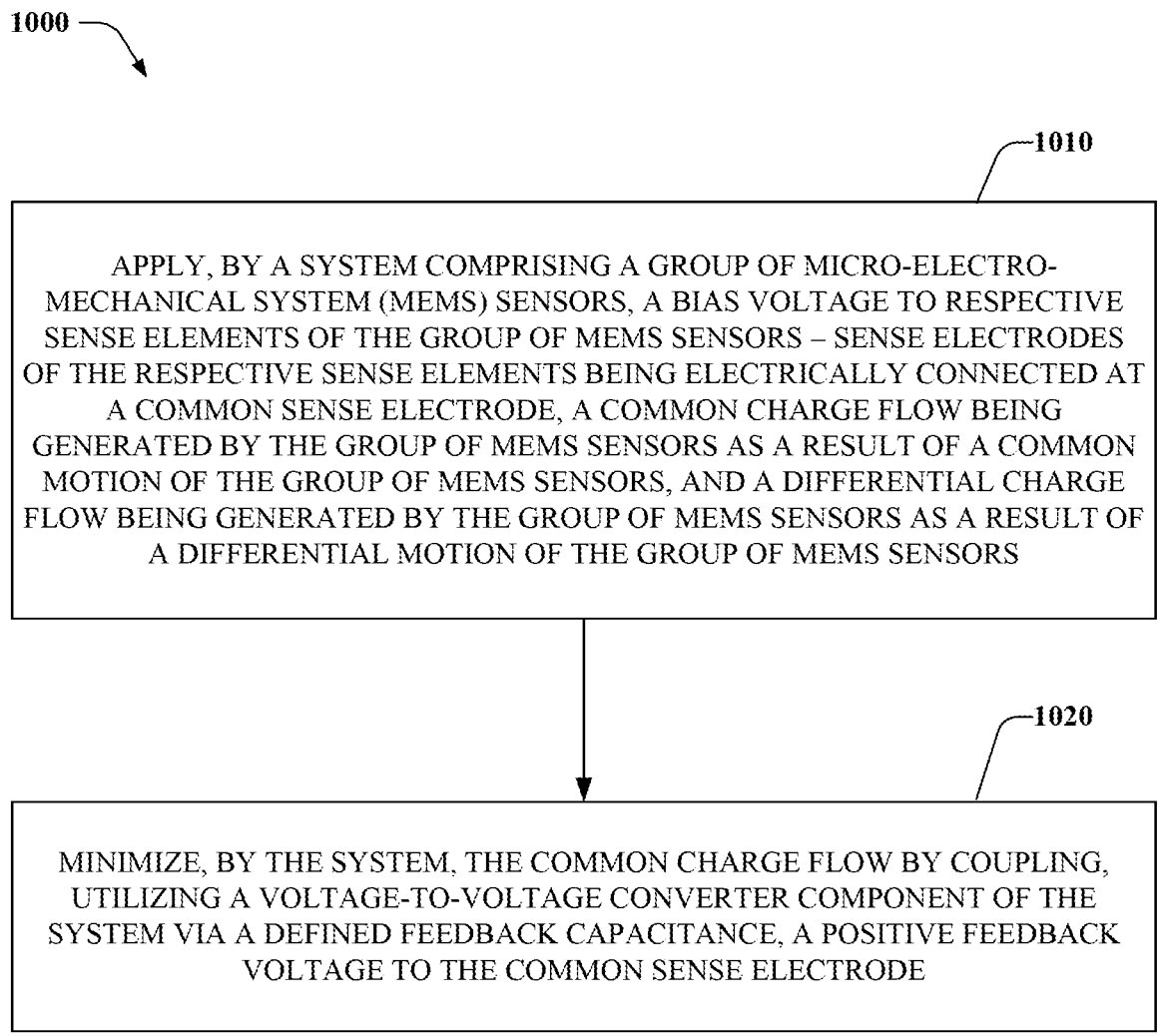
FIG. 10 illustrates a flowchart of a method associated with minimizing a common charge flow at a common sense electrode of a group of micro-electro-mechanical system (MEMS) sensors resulting from a common motion of the group of MEMS sensors, in accordance with various example embodiments.

FIG. 10 illustrates a methodology in accordance with the disclosed subject matter. For simplicity of explanation, the methodology is depicted and described as a series of acts. It is to be understood and appreciated that various embodiments disclosed herein are not limited by the acts illustrated and/or by the order of acts. For example, acts can occur in various orders and/or concurrently, and with other acts not presented or described herein. Furthermore, not all illustrated acts may be required to implement the methodology in accordance with the disclosed subject matter. In addition, those skilled in the art will understand and appreciate that the methodology could alternatively be represented as respective series of interrelated states via respective state diagrams or events.

Referring now to FIG. 10, a flowchart of a method (1000) associated with minimizing a common charge flow at a common sense electrode of a group of MEMS sensors resulting from a common motion of the group of MEMS sensors is illustrated, in accordance with various example embodiments. At 1010, a system (e.g., 100) comprising the group of MEMS sensors can apply a bias voltage to respective sense elements of the group of MEMS sensors, in which sense electrodes of the respective sense elements are electrically connected at a common sense electrode, the group of MEMS sensors generate a common charge flow as a result of the common motion of the group of MEMS sensors, and the group of MEMS sensors generate a differential charge flow as a result of a differential motion of the group of MEMS sensors.

At 1020, the system can minimize the common charge flow by coupling, utilizing a V2V converter component of the system via a defined feedback capacitance, a positive feedback voltage to the common sense electrode.

In an embodiment, the minimizing the common charge flow comprises maintaining, via the V2V converter component, a constant charge at the common sense electrode.

In another embodiment, the common motion corresponds to a common mode resonant frequency of the group of MEMS sensors, the differential motion corresponds to a differential mode resonant frequency of the group of MEMS sensors, and the minimizing the common charge flow increases a separation between the common mode resonant frequency and the differential mode resonant frequency.

In yet another embodiment, the minimizing the common charge flow further decreases a magnitude of an output, e.g., voltage, of the group of MEMS sensors corresponding to the common mode resonant frequency.

Figure 11:
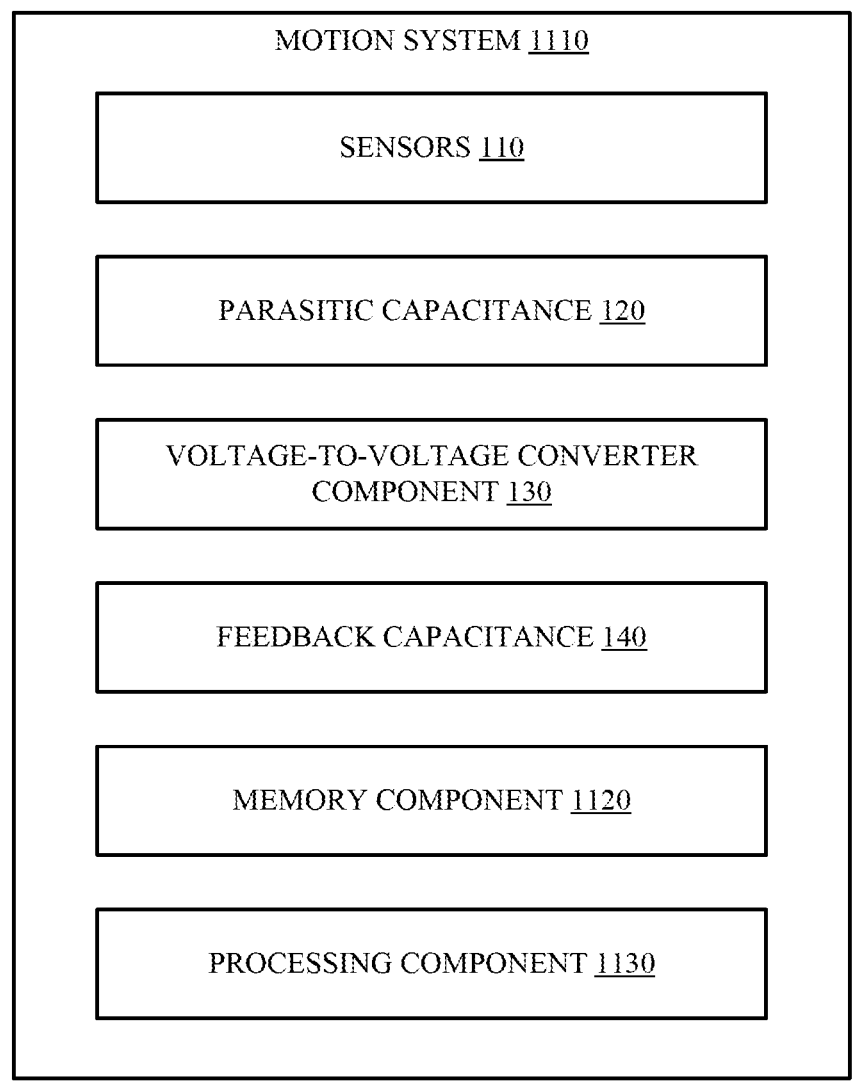
FIG. 11 illustrates a motion system comprising a sensor architecture that utilizes a V2V converter component to apply a positive feedback voltage to a common sense electrode of a group of electromechanical sensors to minimize a common charge flow resulting from a common motion of the group of electromechanical sensors, in accordance with various example embodiments.

FIG. 11 illustrates a motion system (1110), e.g., a gyroscope, etc. comprising a sensor architecture that utilizes a V2V converter component (130) to couple, via a feedback capacitance (140), a positive feedback voltage to sense elements of a group of sensors (110) of the system to facilitate a reduction, at a common sense electrode of the group of sensors, a common charge flow due to a common motion of the group of sensors—the common charge flow changing an electrostatic force of respective sense elements of the group of sensors, and the change in electrostatic force representing spring softening of the sense elements, in accordance with various example embodiments. In this regard, the motion system can utilize a memory component (1120) and a processing component (1130) to perform, via the V2V converter component, various operations described herein, e.g., with respect to using, controlling, etc. the defined self-test voltage to generate a defined force, or defined sense gap displacement, on a sense element (e.g., a proof mass) of the sensor, e.g., to perform a "self-test" on the sensor, e.g., to compare detected voltage values (e.g., obtained via sense electrode(s) corresponding to various portions, stages, etc. of the V2V converter component, the feedback capacitor, etc.) to expected voltage values, e.g., that have been determined to be generated based on the defined sense gap displacement, etc.

As it employed in the subject specification, the term "component" refers to substantially any analog and/or digital based device(s), circuit(s), etc. comprising, e.g., a resistor, a capacitor, a transistor, a diode, an inductor, a memory, a programmable device, e.g., fuse, field programmable gate array (FPGA), complex programmable logic device (CPLD), etc. relevant to performing operations and/or functions of circuit(s), device(s), system(s), etc. disclosed herein. Further, the term "processing component" can refer to substantially any computing processing unit or device (e.g., MAC, etc.), comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an ASIC, a digital signal processor (DSP), an FPGA, a programmable logic controller (PLC), a CPLD, a discrete gate or transistor logic, discrete hardware components, an analog circuit, or any combination thereof designed to perform the functions and/or processes described herein. Further, a processor can exploit nano-scale architectures such as, but not limited to, molecular and quantum-dot based transistors, switches and gates, e.g., in order to optimize space usage or enhance performance of mobile devices. A processor can also be implemented as a combination of computing processing units, devices, etc.

In the subject specification, the term "memory", "memory component", and substantially any other information storage component relevant to operation and functionality of a motion system (e.g., 1110) and/or devices disclosed herein refer to "memory components," or entities embodied in a "memory," or components comprising the memory. It will be appreciated that the memory can include volatile memory and/or nonvolatile memory. By way of illustration, and not limitation, volatile memory, can include random access memory (RAM), which can act as external cache memory. By way of illustration and not limitation, RAM can include synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and/or Rambus dynamic RAM (RDRAM). In other embodiment(s) nonvolatile memory can include read only memory (ROM), programmable ROM (PROM), electrically programmable ROM (EPROM), electrically erasable ROM (EEPROM), or flash memory. Additionally, the components and/or devices disclosed herein can comprise, without being limited to comprising, these and any other suitable types of memory.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

Furthermore, to the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Aspects of systems, apparatus, devices, processes, and process blocks explained herein can be embodied within hardware, such as an ASIC or the like. Moreover, the order in which some or all of the process blocks appear in each process should not be deemed limiting. Rather, it should be understood by a person of ordinary skill in the art having the benefit of the instant disclosure that some of the process blocks can be executed in a variety of orders not illustrated.

Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art having the benefit of the instant disclosure.

The above description of illustrated embodiments of the subject disclosure is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A system, comprising:
    a group of electromechanical sensors that generate a common charge flow as a result of a common motion of the group of electromechanical sensors and a differential charge flow as a result of a differential motion of the group of electromechanical sensors, wherein respective sense elements of the group of electromechanical sensors have been electrically connected at a common sense electrode; and
    a voltage-to-voltage converter component that
        generates, via an output of the voltage-to-voltage converter component, a positive feedback voltage, and minimizes the common charge flow by coupling, via a defined feedback capacitance, the positive feedback voltage to the common sense electrode, wherein the common sense electrode is electrically coupled to an input of the voltage-to-voltage converter component.

2. The system of claim 1, wherein the voltage-to-voltage converter component minimizes the common charge flow by maintaining, via the defined feedback capacitance, a constant charge at the common sense electrode.

3. The system of claim 1, wherein the common motion corresponds to a common motion resonant frequency of the group of electromechanical sensors, wherein the differential motion corresponds to a differential motion resonant frequency of the group of electromechanical sensors, and wherein the maintaining the constant charge results in further separation of the common motion resonant frequency from the differential motion resonant frequency.

4. The system of claim 3, wherein in response to the maintaining the constant charge at the common sense electrode, the voltage-to-voltage converter component decreases a magnitude of an output of the group of electromechanical sensors corresponding to the common motion resonant frequency.

5. The system of claim 1, wherein the respective sense elements comprise capacitive sense elements, and further comprising:
    a bias voltage component that applies a bias voltage to the capacitive sense elements.

6. The system of claim 5, wherein the voltage-to-voltage converter component comprises a unity-gain voltage buffer comprising, within a defined error tolerance, a gain of one, and wherein the input of the voltage-to-voltage converter component is electrically connected to an input of the unity-gain voltage buffer.

7. The system of claim 6, wherein the input of the unity-gain voltage buffer is electrically connected to a first capacitance terminal of a defined shield capacitance of the system, wherein an output of the unity-gain voltage buffer is electrically connected to a second capacitance terminal of the defined shield capacitance, and wherein the unity-gain voltage buffer comprises a bootstrapping buffer.

8. The system of claim 7, wherein the defined shield capacitance corresponds to at least one electrical trace of the system that facilitates shielding at least a portion of the common sense electrode from an electromagnetic field.

9. The system of claim 8, wherein the voltage-to-voltage converter component further comprises:
    a defined input capacitance;
    a defined amplifier feedback capacitance;
    an inverting amplifier comprising a defined negative gain represented by a ratio of the defined input capacitance to the defined amplifier feedback capacitance, wherein the defined input capacitance is electrically coupled between the output of the unity-gain voltage buffer and an input of the inverting amplifier, and wherein the defined amplifier feedback capacitance is electrically coupled between the input of the inverting amplifier and an output of the inverting amplifier; and
    a unity-gain inverting voltage buffer comprising, within a defined error tolerance, a gain of negative one, wherein the output of the inverting amplifier is electrically coupled to an input of the unity-gain inverting voltage buffer, and wherein an output of the unity-gain inverting voltage buffer is electrically coupled to the output of the voltage-to-voltage converter component.

10. The system of claim 9, further comprising a defined parasitic capacitance that is electrically connected to the input of the voltage-to-voltage converter component.

11. The system of claim 10, wherein a value of the defined feedback capacitance is proportional, based on the defined negative gain of the inverting amplifier, to the defined parasitic capacitance.

12. The system of claim 9, wherein the input of the inverting amplifier is coupled, via a coupling capacitance, to a defined self-test voltage that facilitates generation of a force on at least one sense element of the respective sense elements.

13. The system of claim 1, wherein the voltage-to-voltage converter component further comprises:
   a defined input capacitance;
   a defined amplifier feedback capacitance;
   an inverting amplifier comprising a defined negative gain represented by a ratio of the defined input capacitance to the defined amplifier feedback capacitance, wherein the defined input capacitance is electrically coupled between the input of the voltage-to-voltage converter component and an input of the inverting amplifier, and wherein the defined amplifier feedback capacitance is electrically coupled between the input of the inverting amplifier and an output of the inverting amplifier; and
   a unity-gain inverting voltage buffer comprising, within a defined error tolerance, a gain of negative one, wherein the output of the inverting amplifier is electrically connected to an input of the unity-gain inverting voltage buffer, and wherein an output of the unity-gain inverting voltage buffer is electrically connected to the output of the voltage-to-voltage converter component.

14. The system of claim 13, further comprising a defined parasitic capacitance that is electrically connected to the input of the voltage-to-voltage converter component.

15. The system of claim 14, wherein the defined parasitic capacitance comprises a defined shield capacitance corresponding to at least one electrical trace of the system that facilitates shielding at least a portion of the respective sense elements from an electromagnetic field.

16. The system of claim 15, wherein a value of the defined feedback capacitance is proportional, based on the defined negative gain of the inverting amplifier, to a sum of the defined parasitic capacitance and the defined input capacitance.

17. The system of claim 13, wherein the input of the inverting amplifier is coupled, via a coupling capacitance, to a defined self-test voltage that facilitates generation of a force on at least one sense element of the respective sense elements.

18. A method, comprising:
   applying, by a system comprising a group of micro-electro-mechanical system (MEMS) sensors, a bias voltage to respective sense elements of the group of MEMS sensors, wherein sense electrodes of the respective sense elements are electrically connected at a common sense electrode, wherein the group of MEMS sensors generate a common charge flow as a result of a common motion of the group of MEMS sensors, and wherein the group of MEMS sensors generate a differential charge flow as a result of a differential motion of the group of MEMS sensors; and
   minimizing, by the system, the common charge flow by coupling, utilizing a voltage-to-voltage converter component of the system via a defined feedback capacitance, a positive feedback voltage to the common sense electrode.

19. The method of claim 18, wherein the minimizing the common charge flow comprises:
   maintaining, via the voltage-to-voltage converter component, a constant charge at the common sense electrode.

20. The method of claim 18, wherein the common motion corresponds to a common mode resonant frequency of the group of MEMS sensors, wherein the differential motion corresponds to a differential mode resonant frequency of the group of MEMS sensors, and wherein the minimizing the common charge flow increases a separation between the common mode resonant frequency and the differential mode resonant frequency.

21. The method of claim 20, wherein the minimizing the common charge flow further decreases a magnitude of an output of the group of MEMS sensors corresponding to the common mode resonant frequency.

22. A system, comprising:
   a micro-electro-mechanical system (MEMS) sensor comprising proof masses that have been electrically connected at respective sense nodes, wherein the proof masses generate a common charge flow as a result of an in-phase movement of the proof masses, and wherein the proof masses generate a differential charge flow as a result of an out-of-phase movement of the proof masses; and
   a voltage-to-voltage converter component comprising a differential amplifier, wherein the voltage-to-voltage converter component minimizes the common charge flow by coupling, via respective defined feedback capacitances, a positive differential feedback voltage to the respective sense nodes, wherein the respective sense nodes are electrically coupled to respective inputs of the voltage-to-voltage converter component.

23. The system of claim 22, wherein respective defined input capacitances of the system are electrically coupled between the respective sense nodes and differential inputs of the differential amplifier.

24. The system of claim 23, wherein respective defined amplifier feedback capacitances are electrically coupled between the differential inputs of the differential amplifier and respective outputs of the differential amplifier, and wherein the respective defined feedback capacitances are electrically coupled between the respective outputs of the differential amplifier and the respective sense nodes.

25. The system of claim 22, wherein the in-phase movement corresponds to first resonant frequency of the proof masses, wherein the out-of-phase movement corresponds to a second resonant frequency of the proof masses, and wherein the voltage-to-voltage converter component, based on a minimization of the common charge flow, increases a separation between the first resonant frequency and the second resonant frequency.

26. The system of claim 25, wherein the voltage-to-voltage converter component, based on the minimization of the common charge flow, decreases a magnitude of an output of the proof masses corresponding to the first resonant frequency.

* * * * *